(12) United States Patent
    Inaoka et al.

(10) Patent No.: US 9,717,142 B2
(45) Date of Patent: Jul. 25, 2017

(54) MULTILAYER WIRING SUBSTRATE, METHOD OF PRODUCING THE SAME, AND SEMICONDUCTOR PRODUCT

(71) Applicant: Sony Corporation, Tokyo (JP)

(72) Inventors: Toshiyuki Inaoka, Ishikawa (JP); Atsuhiro Uratsuji, Ishikawa (JP)

( * ) Notice: Subject to any disclaimer, the term of this patent is extended or adjusted under 35 U.S.C. 154(b) by 310 days.

(21) Appl. No.: 14/328,131

(22) Filed: Jul. 10, 2014

(65) Prior Publication Data
    US 2015/0029677 A1    Jan. 29, 2015

(30) Foreign Application Priority Data
    Jul. 23, 2013   (JP) ................................. 2013-152896

(51) Int. Cl.
    H05K 1/02    (2006.01)
    H05K 3/46    (2006.01)
    H05K 3/00    (2006.01)
    H05K 1/18    (2006.01)

(52) U.S. Cl.
    CPC .......... H05K 1/0271 (2013.01); H05K 3/465 (2013.01); H05K 1/181 (2013.01); H05K 3/0032 (2013.01); H05K 2201/10121 (2013.01)

(58) Field of Classification Search
    None
    See application file for complete search history.

(56) References Cited

U.S. PATENT DOCUMENTS

| 5,325,583 | A  | * | 7/1994  | Shimizu ............... H05K 3/041 156/261 |
| 6,224,965 | B1 | * | 5/2001  | Haas .................. H05K 1/0373 428/209 |
| 6,869,665 | B2 | * | 3/2005  | Tani ..................... H05K 1/056 174/250 |
| 7,468,490 | B2 | * | 12/2008 | Hayashi ............... H05K 1/162 174/255 |
| 9,408,314 | B2 | * | 8/2016  | Vasoya .............. H05K 3/4608 |
| 2001/0023779 | A1 | * | 9/2001 | Sugaya ................ H05K 1/16 174/255 |
| 2001/0023780 | A1 | * | 9/2001 | Mori .................. H05K 1/0271 174/255 |
| 2001/0023781 | A1 | * | 9/2001 | Muramatsu ......... H05K 3/3447 174/260 |
| 2003/0085422 | A1 | * | 5/2003 | Amali ................. H01L 29/407 257/329 |
| 2003/0132025 | A1 | * | 7/2003 | Wakihara ........... H05K 1/0269 174/256 |
| 2004/0014451 | A1 | * | 1/2004 | Sapp ................ H01L 29/0634 455/335 |
| 2004/0069636 | A1 | * | 4/2004 | Meyer ................... G03F 7/202 204/471 |

(Continued)

FOREIGN PATENT DOCUMENTS

| JP | 2000-013019 | 1/2000 |
| JP | 2002-324952 | 11/2002 |
| JP | 2007-067010 | 3/2007 |

Primary Examiner — Jeremy C Norris
Assistant Examiner — Muhammed Azam
(74) Attorney, Agent, or Firm — K&L Gates LLP (57) ABSTRACT

A multilayer wiring substrate, a method of producing and a semiconductor product includes: a trench produced at one surface of an insulation layer, the trench having a depth shallower than a thickness of the insulation layer; and a copper plating applied to the trench.

6 Claims, 9 Drawing Sheets

(56) References Cited

U.S. PATENT DOCUMENTS

| | | | |
|---|---|---|---|
| 2004/0118600 A1* | 6/2004 | Lee | H05K 1/162 174/260 |
| 2004/0142573 A1* | 7/2004 | Osanai | H01L 29/7802 438/694 |
| 2004/0173845 A1* | 9/2004 | Aoki | H01L 21/28185 257/329 |
| 2005/0085042 A1* | 4/2005 | Chun | H01L 21/76229 438/275 |
| 2005/0189585 A1* | 9/2005 | Jones | H01L 29/0886 257/330 |
| 2005/0260790 A1* | 11/2005 | Goodner | H01L 21/4846 438/106 |
| 2006/0165877 A1* | 7/2006 | Yanagimoto | C23C 18/04 427/58 |
| 2006/0207888 A1* | 9/2006 | Taylor | C25F 3/02 205/646 |
| 2007/0018241 A1* | 1/2007 | Amali | H01L 29/66719 257/330 |
| 2007/0158104 A1* | 7/2007 | Fujinami | H05K 3/108 174/261 |
| 2007/0199735 A1* | 8/2007 | Kim | H05K 3/423 174/255 |
| 2007/0251088 A1* | 11/2007 | Susaki | C25D 7/04 29/830 |
| 2007/0272654 A1* | 11/2007 | Huang | H05K 3/243 216/13 |
| 2008/0011507 A1* | 1/2008 | Vasoya | H05K 1/0313 174/260 |
| 2009/0166320 A1* | 7/2009 | Jomaa | H05K 3/107 216/17 |
| 2009/0246462 A1* | 10/2009 | Jomaa | H05K 3/387 428/141 |
| 2009/0260868 A1* | 10/2009 | Oh | H05K 3/4647 174/262 |
| 2009/0314525 A1* | 12/2009 | Kajino | H05K 1/0265 174/255 |
| 2010/0065314 A1* | 3/2010 | Lin | H01L 23/49894 174/258 |
| 2010/0116530 A1* | 5/2010 | Okazaki | H05K 3/4688 174/257 |
| 2010/0294554 A1* | 11/2010 | Okazaki | H05K 1/0271 174/261 |
| 2011/0067909 A1* | 3/2011 | Cheng | H05K 1/0265 174/257 |
| 2011/0147056 A1* | 6/2011 | Tseng | H05K 3/465 174/256 |
| 2011/0155428 A1* | 6/2011 | Tseng | C23C 18/1612 174/257 |
| 2011/0155441 A1* | 6/2011 | Tseng | H05K 3/465 174/266 |
| 2012/0199386 A1* | 8/2012 | Adachi | H05K 3/445 174/258 |
| 2013/0192881 A1* | 8/2013 | Lee | H05K 3/465 174/251 |
| 2013/0199825 A1* | 8/2013 | Bruderer | H05K 3/465 174/251 |
| 2014/0041921 A1* | 2/2014 | Gonya | H05K 3/4644 174/262 |
| 2014/0174791 A1* | 6/2014 | Yu | H05K 3/465 174/251 |
| 2015/0041184 A1* | 2/2015 | Nam | H05K 3/4602 174/251 |

* cited by examiner

MULTILAYER WIRING SUBSTRATE, METHOD OF PRODUCING THE SAME, AND SEMICONDUCTOR PRODUCT

CROSS REFERENCES TO RELATED APPLICATIONS

The present application claims priority to Japanese Priority Patent Application JP 2013-152896 filed in the Japan Patent Office on Jul. 23, 2013, the entire content of which is hereby incorporated by reference.

BACKGROUND

The present disclosure relates to a multilayer wiring substrate, a method of producing the same, and a semiconductor product. More particularly, the present disclosure relates to a multilayer wiring substrate, a method of producing the same, and a semiconductor produce that can be prevented from warping without thickening a total plate thickness.

SUMMARY

A multilayer wiring substrate provided by laminating a plurality of materials may be warped by a difference between thermal expansion coefficients or between thermal curing shrinkage ratios of the respective materials. In order to prevent warpage, as generally known, thicknesses of a conductor and an insulation layer are enlarged to provide stiffness, a material having a low thermal expansion coefficient or thermal curing shrinkage ratio is used, remaining copper ratios in different conductor layers are matched, and so on.

However, if the thicknesses of the conductor and the insulation layer are enlarged, a total thickness is enlarged, and a demand for a thin and small-sized multilayer wiring substrate cannot be satisfied. In addition, as the material having a low thermal expansion coefficient is expensive, a demand for low costs cannot be satisfied.

Japanese Patent Application Laid-open No. 2000-13019 proposes that a conductor dummy pattern is disposed at an outer periphery of a product where is not used for a product wiring to provide stiffness and to prevent warpage. Japanese Patent Application Laid-open No. 2002-324952 proposes that conduction holes are disposed in a wastable substrate to provide stiffness and to prevent warpage.

Further, Japanese Patent Application Laid-open No. 2007-67010 proposes that dummy slits are disposed at areas other than circuit areas having conductor patterns for a product and penetrate through an inner layer conductor to provide stiffness and to prevent warpage.

In a proposal of Japanese Patent Application Laid-open No. 2000-13019, there is provided lower stiffness than expected and a warpage prevention effect may be lowered, as a thin conductor is necessary in response to a demand for a thin multilayer wiring substrate. In a proposal of Japanese Patent Application Laid-open No. 2002-324952, it is expected that stiffness can be provided in a substrate mounting step. However, product areas have no conduction holes. After mounting, when the product areas are separated, warpage may be generated.

In a proposal of Japanese Patent Application Laid-open No. 2007-67010, dummy slits penetrating an insulation layer should be disposed at areas where are not used for a product wiring, and wirings are necessary for the dummy slits in the inner layer. Accordingly, there are areas where the dummy slits cannot be disposed due to a demand for a small-sized multilayer wiring substrate, and a warpage prevention effect may be lowered.

In view of the above, there is a need to prevent warpage of a multilayer wiring substrate without thickening and using expensive materials while a thin and small-sized multilayer wiring substrate can be provided at low costs.

It is desirable to provide a multilayer wiring substrate prevented from warping without thickening a total plate thickness.

According to an embodiment of the present application, there is provided a multilayer wiring substrate, including:

a trench produced at one surface of an insulation layer, the trench having a depth shallower than a thickness of the insulation layer; and a copper plating applied to the trench.

The insulation layer is a build-up layer.

The insulation layer is a core layer.

The insulation layer is an epoxy material including a glass cloth.

The copper plating is applied to fill the trench.

The trench does not penetrate through from the one surface to the other surface of the trench.

The trench is produced at about half depth of the insulation layer.

The trench is produced, at the one surface of the insulation layer, in a ground or a power source pattern.

According to an embodiment of the present application, there is provided a method of producing a multilayer wiring substrate, including:

producing a trench having a depth shallower than a thickness of an insulation layer on one surface of the insulation layer; and applying a copper plating to the trench produced on the insulation layer.

According to an embodiment of the present application, there is provided a semiconductor product, including:

a multilayer wiring substrate, having:
a trench produced at one surface of an insulation layer, the trench having a depth shallower than a thickness of the insulation layer; and
a copper plating applied to the trench.

The semiconductor product is a camera module.

According to an embodiment of the present application, a trench having a depth shallower than a thickness of an insulation layer is produced on one surface of the insulation layer, and a copper is plated to the trench produced on the insulation layer.

According to an embodiment of the present application, a multilayer wiring substrate includes a trench having a depth shallower than a thickness of the insulation layer produced at one surface of the insulation layer, and copper plating applied to the trench.

According to the present application, there is provided a multilayer wiring substrate prevented from warping without thickening a total plate thickness.

It should be understood by those skilled in the art that various modifications, combinations, sub-combinations and alterations may occur depending on design requirements and other factors insofar as they are within the scope of the appended claims or the equivalents thereof.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

DETAILED DESCRIPTION

Hereinafter, an embodiment of the present disclosure will be described with reference to the drawings.

The embodiments of the present disclosure will be described in the following order.
1. First Embodiment (Multilayer Wiring Substrate)
2. Second Embodiment (Semiconductor Product)

<1. First Embodiment>

[Configuration of Production Apparatus]

Figure 1:
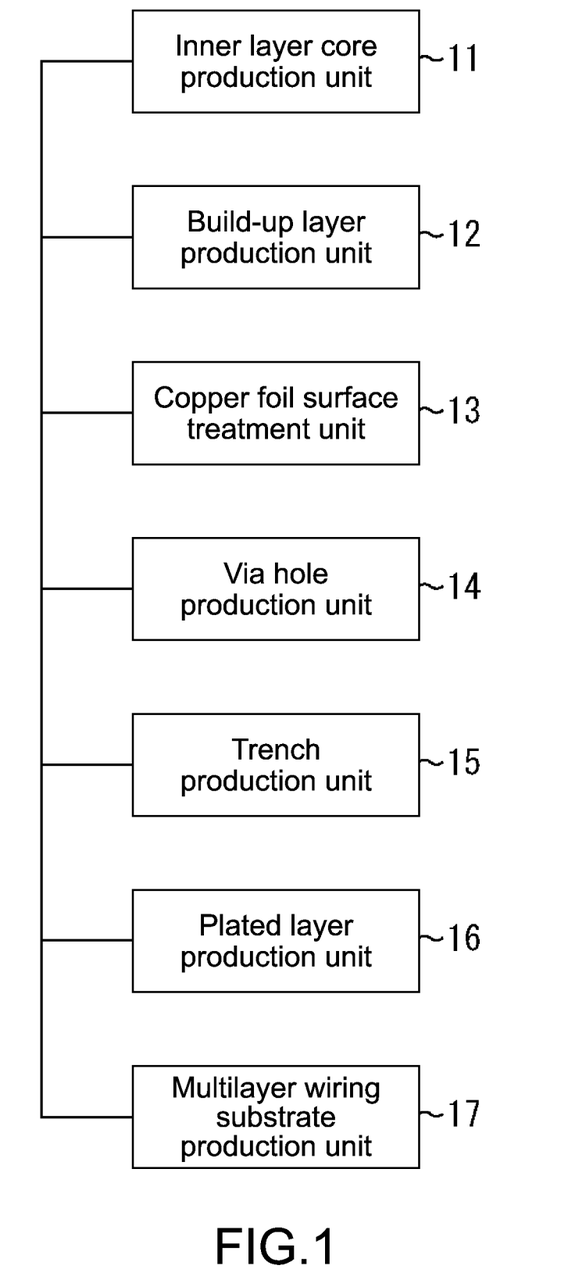
FIG. 1 is a block diagram showing a configuration of an apparatus of producing a multilayer wiring substrate according to an embodiment of the present application.

FIG. 1 is a block diagram showing a configuration of an apparatus of producing a multilayer wiring substrate to which an embodiment of the present application is applied.

The production apparatus is composed of an inner layer core production unit 11, a build-up layer production unit 12, a copper foil surface treatment unit 13, a via hole production unit 14, a trench production unit 15, a plated layer production unit 16, and a multilayer wiring substrate production unit 17.

Figure 3A:
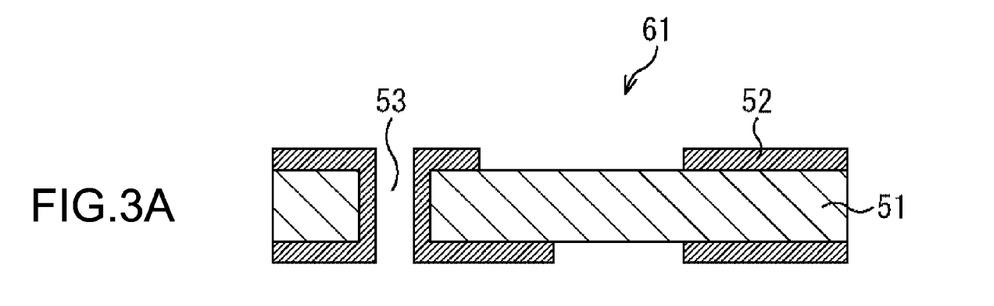
FIGS. 3A to 3C each shows a step for producing a multilayer wiring substrate.

The inner layer production unit 11 produces an inner layer core 61 (FIG. 3A). The build-up layer production unit 12 produces the build-up layers 73 (FIG. 3B) on upper and lower of the inner layer core 61. The copper foil surface treatment unit 13 carries out a copper foil surface treatment after the build-up layers 73 are produced.

The via hole production unit 14 produces a via hole 76 (FIG. 3B) penetrating the build-up layer 73 at a predetermined position of the build-up layer 73 after the copper foil surface treatment. The trench production unit 15 produces trenches 75 (FIG. 3B) not penetrating through lower surfaces of the build-up layers 73 at predetermined positions of upper surfaces of the build-up layers 73.

The plated layer production unit 16 produces seed layers (not shown) and electrolyte copper plating layers 81 (FIG. 3C) on the build-up layers 73 where the via hole 76 and the trenches 75 are produced. The multilayer wiring substrate production unit 17 produces an etching resist on the electrolyte copper plating layer 81 and etches copper to produce a circuit, thereby producing a multilayer wiring substrate 101 (FIG. 4A).

[Production of Multilayer Wiring Substrate]

Figure 2:
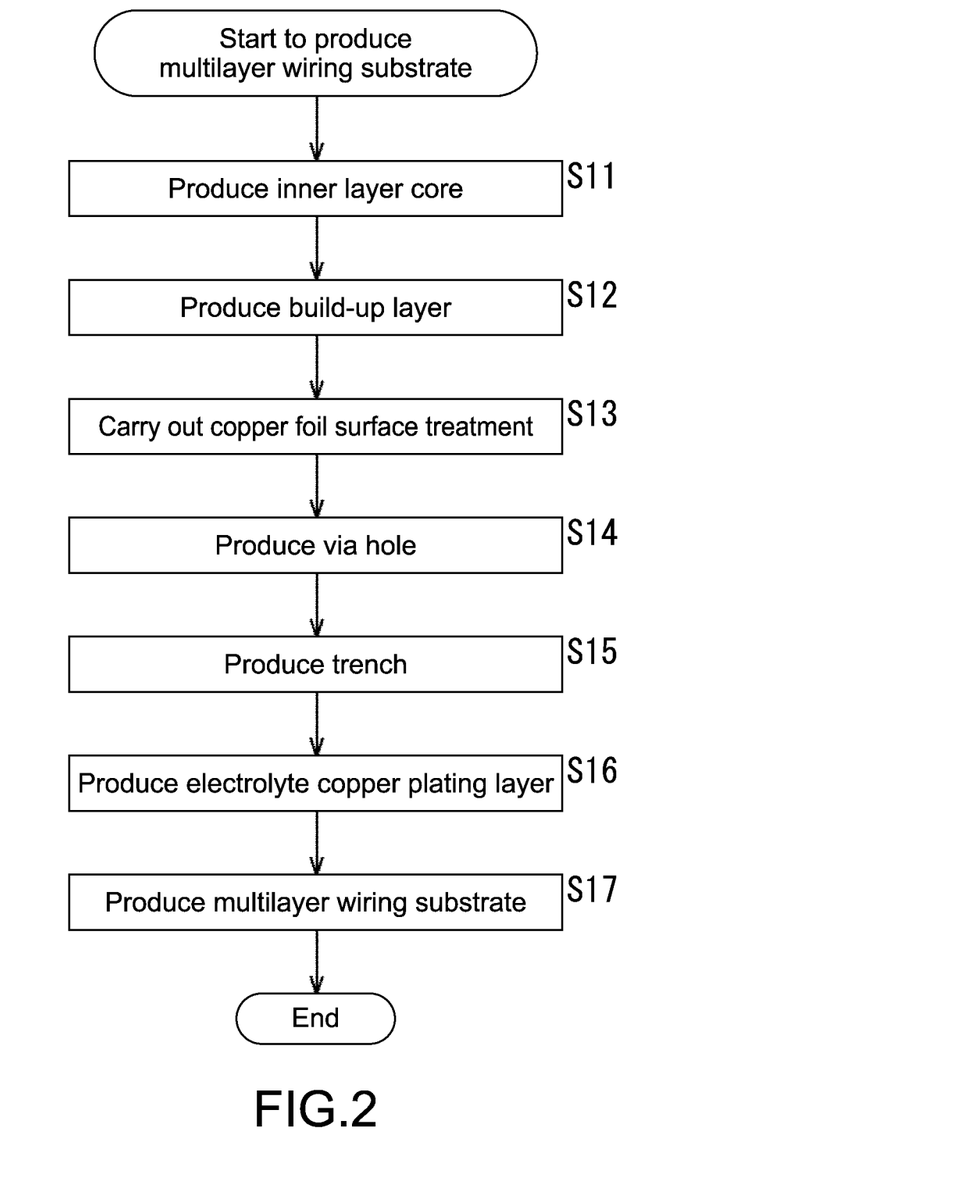
FIG. 2 is a flow chart of steps for producing a multilayer wiring substrate.

Next, referring to the flow chart shown in FIG. 2 and process charts shown in FIGS. 3 and 4, steps for producing a multilayer wiring substrate carried out by the apparatus of producing the multilayer wiring substrate will be described.

Firstly, in the step S11, the inner layer core production unit 11 produces the inner layer core 61 that is a center of the multilayer wiring substrate. Specifically, as shown in FIG. 3A, the inner layer core production unit 11 produces a through hole 53 in a core material 51. Around the through hole 53, a conductor 52 is applied to produce the inner layer core 61.

As the core material 51, a common material for the wiring substrate can be used such as an epoxy material and a polyimide material including a glass cloth.

In the step S12, the build-up layer production unit 12 laminates insulation resins 71 and copper foils 72 on upper and lower of the inner layer core 61 to produce the build-up layers 73. As the insulation resin 71, a typical material configuring the wiring substrate such as an epoxy material including a glass cloth 77 can be used.

In the step S13, in order to well absorb laser light, the copper foil surface treatment unit 13 carries out the copper foil surface treatment after the build-up layers 73 are produced. The copper foil surface treatment is not shown.

Figure 3B:
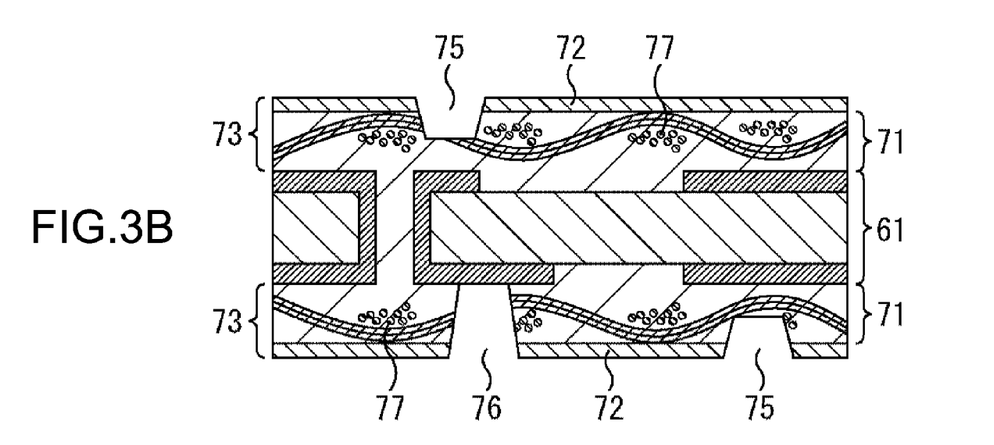

In the step S14, the via hole production unit 14 produces the via hole 76 penetrating from an upper surface to a lower surface of the build-up layer 73 at a predetermined position of the build-up layer 73 using a laser beam drilling equipment (not shown) after the copper foil surface treatment, as shown in FIG. 3B. In this embodiment, the lower surface of each build-up layer 73 refers to a surface in contact with the inner layer core 61, and the upper surface of each build-up layer 73 refers to a surface to which the electrolyte copper plating layer 81 is thereafter applied.

In the step S15, the trench production unit 15 produces the trenches 75 not penetrating through the lower surface (i.e., an inner layer wiring) of the build-up layers 73 at the predetermined positions of the upper surfaces of the build-up layers 73, as shown in FIG. 3B using the laser beam drilling equipment for producing the via hole 76. Herein, the "not penetrating" means that a depth of each trench 75 (a length in a depth direction) is shorter than a thickness (a length in a thickness direction) of the build-up layer 73 that is the insulation layer. In other words, a depth of each trench is shallower than a depth of the build-up layer 73. Specifically, each trench 75 is produced on the upper surface of the build-up layer 73 such that each trench 75 does not penetrate through the lower surface and is shallower than the thickness of the build-up layer 73.

The trenches 75 are produced using a $CO_2$ laser. A laser output, a pulse width and a pulse number are adjusted such that the depth of each trench 75 is about ½ of the insulation layer (for example, the build-up layer 73). If the depth of each trench 75 is too shallower, it is ineffective. If the depth of each trench 75 is deeper, the trenches 75 undesirably penetrate through the lower surface of the build-up layer 73. However, the depth is not limited to the above. A width of each trench 75 is desirably from 50 μm to 150 μm, but is not limited thereto.

The glass cloth 77 of the build-up layer 73 is less thermally decomposed by the $CO_2$ laser as compared to the epoxy material. Accordingly, a processing output and the pulse width of the laser are adjusted as much as one shot so that the glass cloth 77 utilizes the build-up layer 73 to stop to the desirable depth of each trench 75 (to about ½ of the insulation layer). In this manner, the trenches 75 can be produced at a stable depth not penetrating through from the upper surface to the lower surface.

Figure 3C:
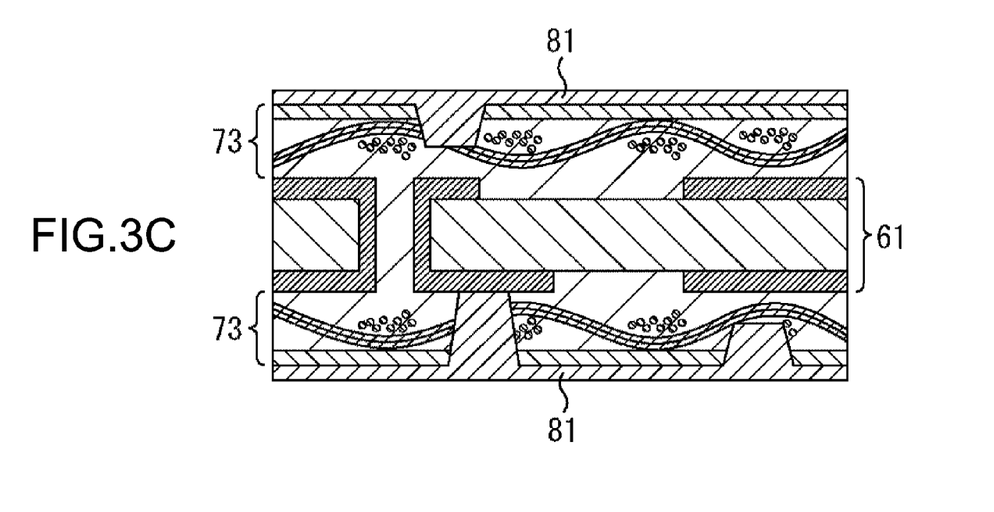
Figure 4A:
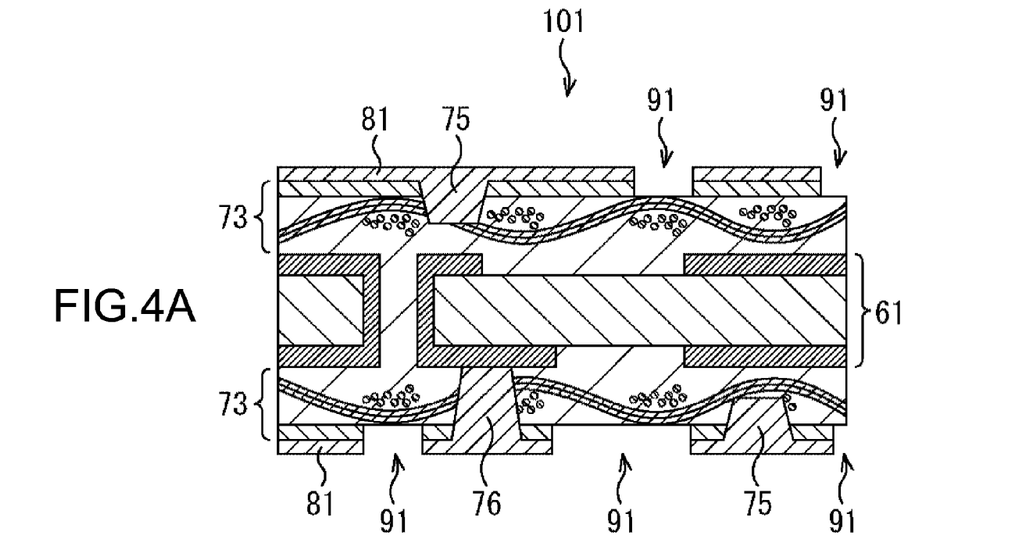
FIGS. 4A and 4B each shows a step for producing a multilayer wiring substrate.

In the step S16, the plated layer production unit 16 produces the seed layer (not shown) and an electrolyte copper plating layer 81 on the build-up layer 73 in which the via hole 76 and the trench 75 are produced as shown in FIG. 3C. In other words, the plated layer production unit 16 produces the seed layer on a whole outer surface including the via hole 76 and the trench 75 produced on the build-up layer 73 by electroless plating or sputtering.

In this case, the trench 75 may not be buried (filled) with the electrolyte copper plating layer 81 to the outer surface, but may be buried (filled) therewith, as shown in FIG. 3C.

In the step S17, the multilayer wiring substrate production unit 17 produces an etching resist on the electrolyte copper plating layer 81 and etches copper with salt iron to produce a circuit 91, thereby producing a multilayer wiring substrate 101, as shown in FIG. 4A.

As described above, the multilayer wiring substrate 101 having the trenches 75 produced that do not penetrate through from the upper surfaces to the lower surfaces of the build-up layers 73, i.e., are shallower than the thicknesses (depths) of the build-up layers 73 on the upper surface of the build-up layers 73.

[Alternative Embodiment]

Figure 4B:
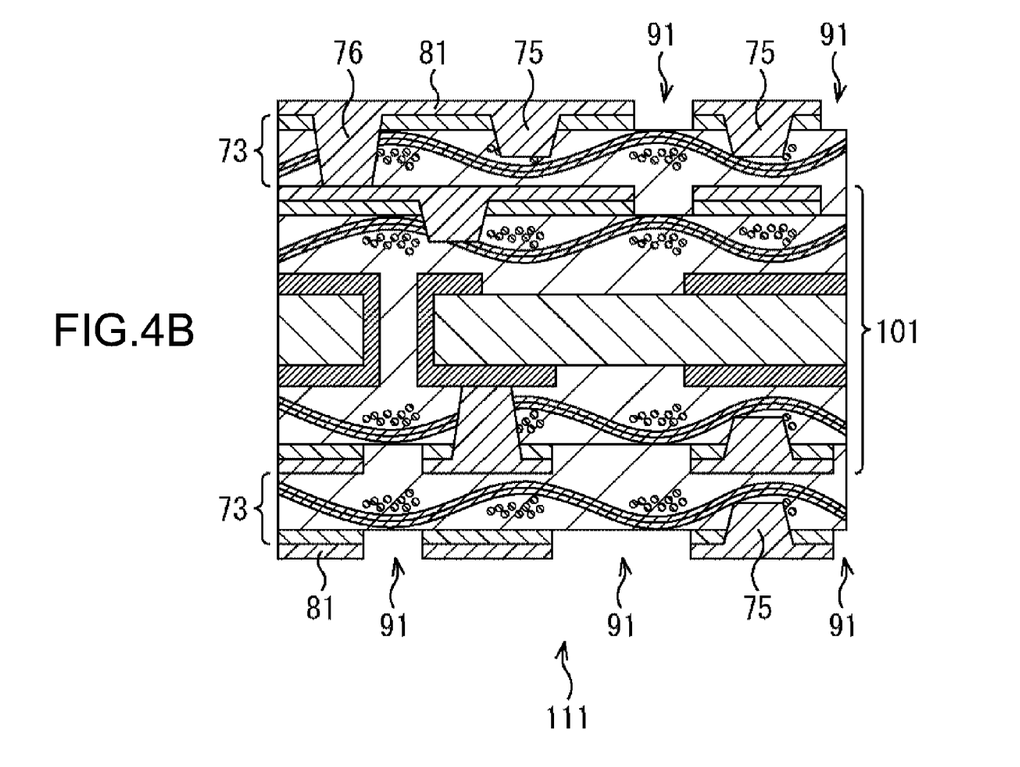

As shown in FIG. 4B, additional build-up layers 73 may be produced on the multilayer wiring substrate 101, as appropriate. A plurality of the build-up layers 73 may be laminated. Every time the build-up layer 73 is laminated, the trench 75 is produced, the electrolyte copper plating layer 81 is filled and the circuit 91 is produced, thereby producing the multilayer wiring substrate 111.

Figure 5:
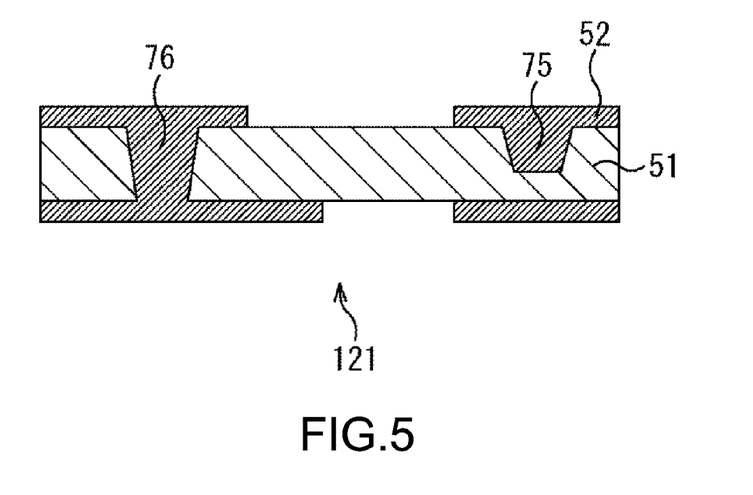
FIG. 5 shows other configuration of an inner layer core.

In the embodiment shown in FIG. 3A, the inner layer core 61 that is the center of the multilayer wiring substrate produces the through hole 53, but it is not limited thereto. For example, as shown in FIG. 5, an inner layer core 121 where an interlayer connection is produced at a via hole 76. In this case, similar to the build-up layer 73, the trench 75 can be produced on one surface of the inner layer core 121 such that the trench 75 is shallower than the thickness of the inner layer core 121 upon laser processing of the via hole 76.

In addition, although the seed layer is produced on the entire surface of the outer layer by electroless plating or sputtering after the via hole 76 and the trench 75 are produced on the build-up layer 73 in the above description, a method of producing a circuit is not limited thereto. For example, after the via hole 76 and the trench 75 are produced by laser on the build-up layer 73, the circuit can be produced by a semi-additive method where a plating resist may be produced to plate copper.

As described above, according to the present application, the thickness of the insulation layer is utilized to produce the trenches by laser processing such that the trenches do not penetrate through the inner layer wiring, i.e., are shallower than the thickness (depth) of the insulation layer, and the trenches are copper plated. Thus, stiffness can be provided without thickening a total plate thickness.

[Arrangement Area]

Figure 6:
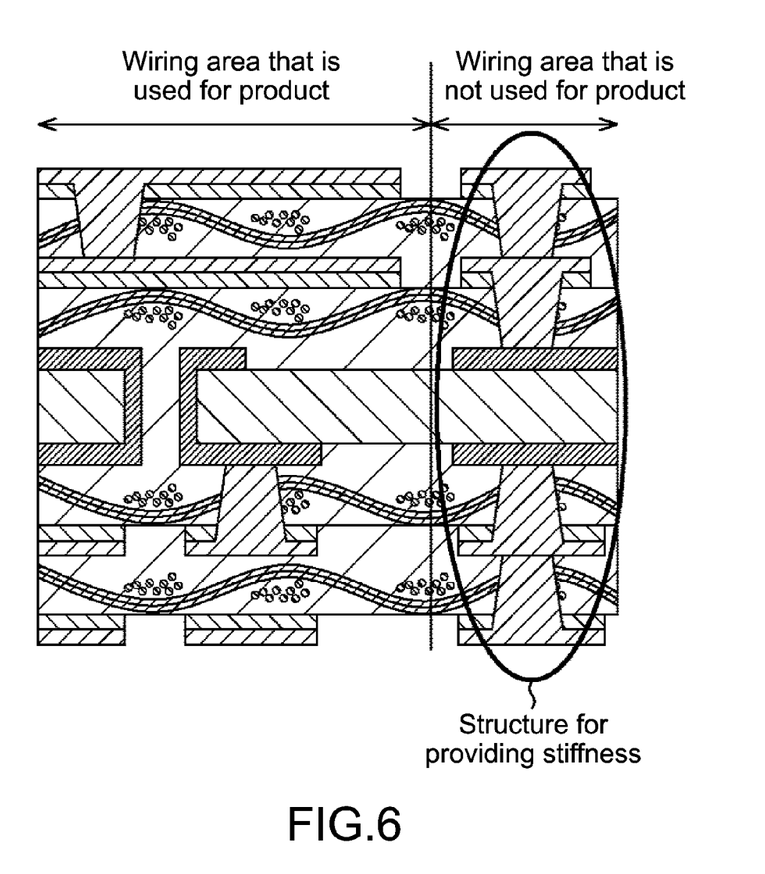
FIG. 6 shows an arrangement of a penetrating structure.

In addition, FIG. 6 shows a structure having dummy slits to penetrate through the inner layer wiring, thereby providing stiffness and a warpage prevention effect. The structure for providing stiffness is difficult to be placed at a wiring area that is used for a product, and can be placed only at a wiring area that is not used for a product.

Figure 7:
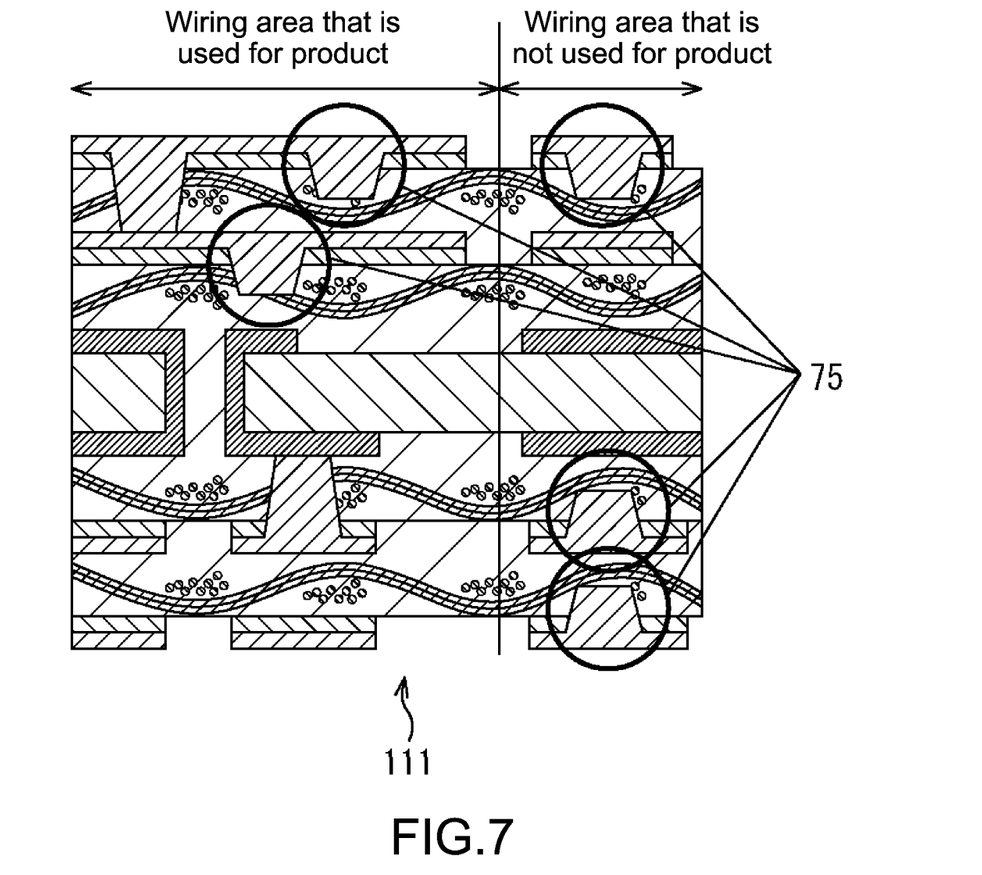
FIG. 7 shows an arrangement of a non-penetrating structure (trenches)

In contrast, the trenches 75 are produced shallower than the thickness of the insulation layer and do not penetrate through from one surface to the other surface of the insulation layer, i.e., not penetrate through an inner layer conductor. In view of this, as shown in FIG. 7, in the multilayer wiring substrate 111, the structure according to an embodiment of the present disclosure can be placed at the wiring area that is used for a product, as long as the structure is a ground or a power source pattern that is uninvolved in a high speed transmission, as well as at the wiring area that is not used for a product.

Figure 8:
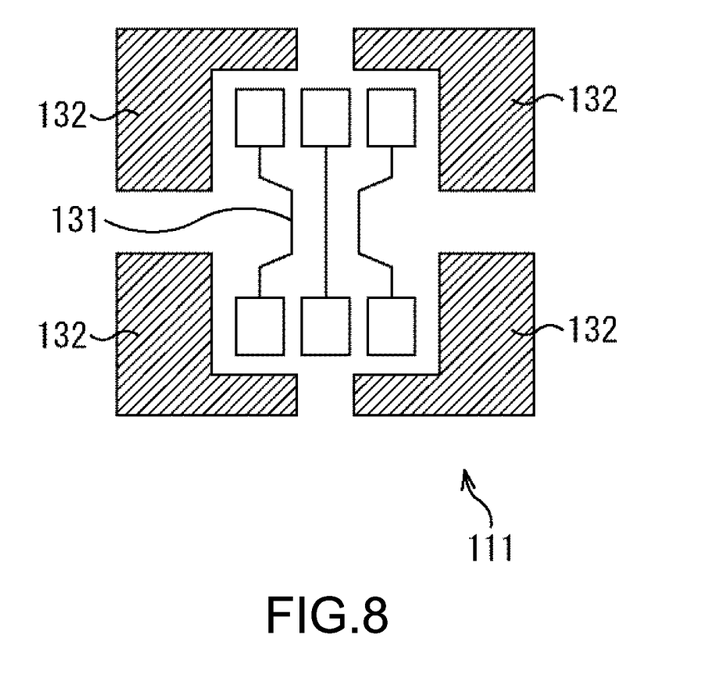
FIG. 8 shows an arrangement of a trench.

In addition, the trenches may be placed at a warped position of the wiring. As shown in FIG. 8, the trench can be placed at a wiring area 131 for a high speed transmission. From a standpoint of interlayer insulation, it is desirable that the trench be placed at a wiring area 132 where a ground or a power source pattern that is uninvolved in a high speed transmission.

As described above, according to the present application, as the wiring area that is used for a product and the rest of the area can have stiffness, the multilayer wiring substrate can be thin and small-sized, and can be prevented from warping.

The present application can be applied not only to the multilayer wiring substrate, but also to a semiconductor product (a chip) using the multilayer wiring substrate.

<2. Second Embodiment>

[Semiconductor Product]

Figure 9:
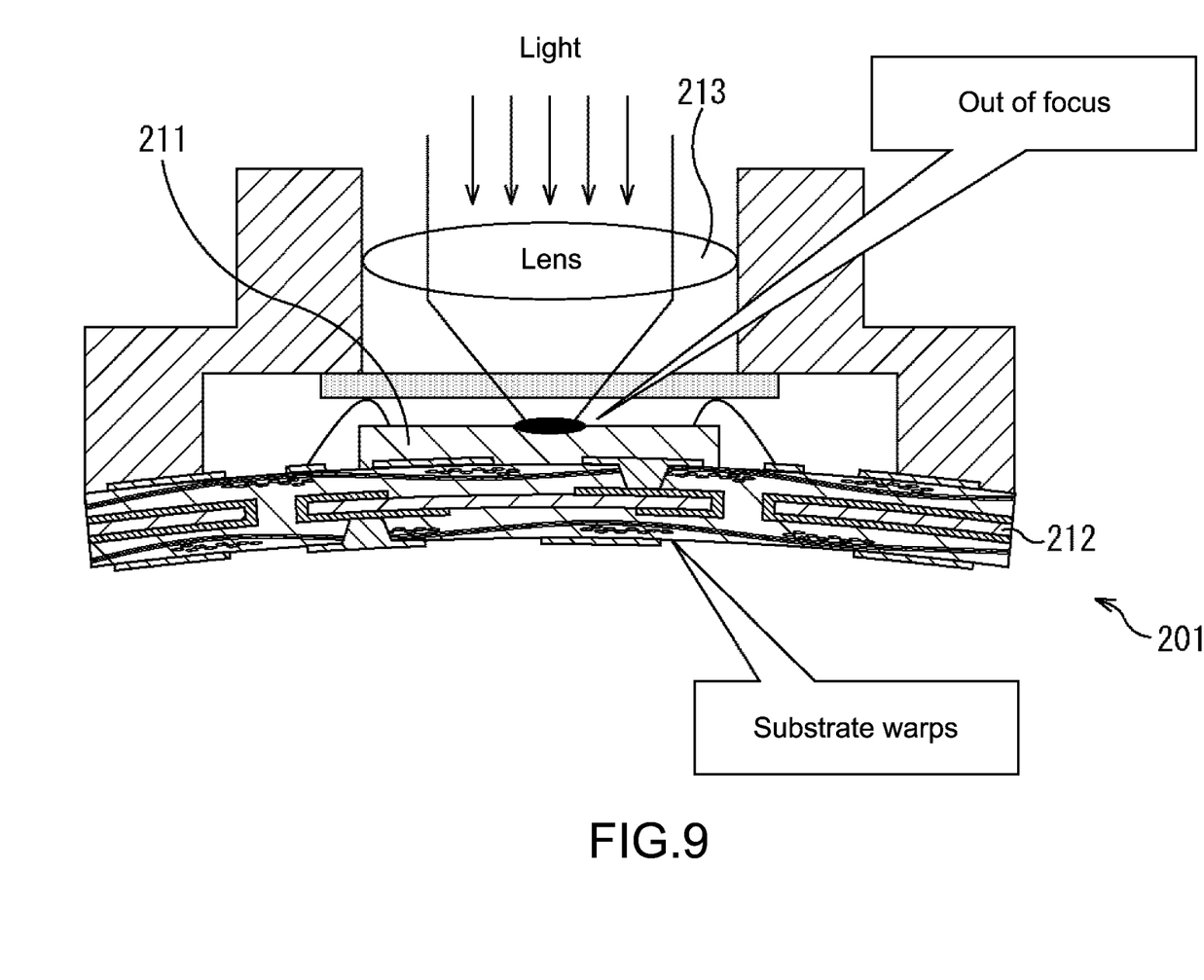
FIG. 9 shows an embodiment of a camera module using a multilayer wiring substrate having dummy slits.

FIG. 9 shows a camera module using a multilayer wiring substrate on which an image sensor is disposed as an example of a semiconductor product (chip) having a multilayer wiring substrate having dummy slits for stiffness on which an electronic device is disposed.

In FIG. 9, a camera module 201 at least includes a multilayer wiring substrate 212 on which an image sensor 211 is disposed, and a lens 213. The multilayer wiring substrate 212 has dummy slits at the wiring area that is not used for a product, for example.

Figure 10:
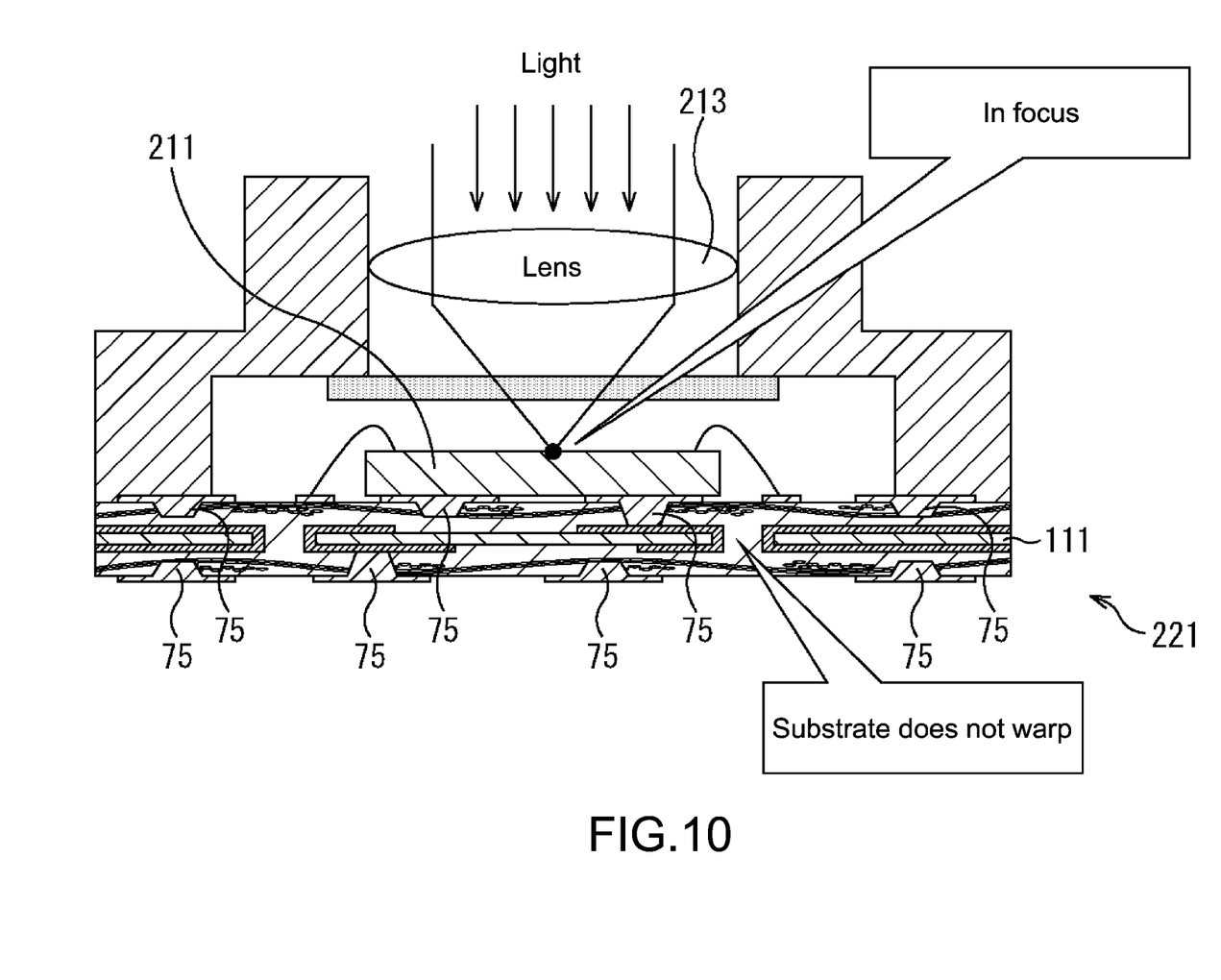
FIG. 10 shows an embodiment of a camera module using a multilayer wiring substrate having trenches.

In contrast, FIG. 10 shows a camera module using a multilayer wiring substrate on which an image sensor is disposed as an example of a semiconductor product (chip) having a multilayer wiring substrate having the trenches 75 for stiffness on which an electronic device is disposed.

In FIG. 10, a camera module 221 at least includes a multilayer wiring substrate 111 on which the image sensor 211 is disposed, and the lens 213. In other words, the multilayer wiring substrate 111 has the trenches 75 for stiffness at the wiring area that is used for a product.

As the multilayer wiring substrate 212 shown in FIG. 9 has no structure for stiffness at the wiring area that is used for a product, the multilayer wiring substrate 212 itself is warped, whereby the lens 213 may be out of focus. As a result, an image quality acquired by the image sensor 211 may be degraded.

In contrast, as the multilayer wiring substrate 111 shown in FIG. 10 has the trenches 75 for stiffness at the wiring area that is used for a product, the multilayer wiring substrate 111 is prevented from warping, and the lens 213 is prevented from being out of focus.

In this way, the image sensor 211 can acquire better image quality having in focus.

In the context of the specification, the above-mentioned steps describing a series of processes involve not only the processes in time series along the described sequences, but also the processes conducted not always in time series but in parallel or separately.

The present disclosure is not limited to the above-described embodiments, and variations and modifications may be made without departing from the scope of the present disclosure.

Also, the respective steps described in the above-mentioned flow chart can be carried out in a single apparatus, but can also be carried out shared by a plurality of apparatuses.

Furthermore, when one step includes a plurality of processes, a plurality of the processes included in one step can be carried out in a single apparatus, but can also be carried out shared by a plurality of apparatuses.

In this contest, a single apparatus (or a single processing unit) may be divided into a plurality of apparatuses (or a plurality of processing units). Conversely, a plurality of apparatuses (or a plurality of processing units) may be collectively configured as a single apparatus (or a single processing unit). It will be appreciated that any configurations other than the described above may be added to each apparatus (or each processing unit). As long as configurations and actions are substantially the same as the whole system, a part of some apparatuses (or some processing units) may be included in other apparatuses (or other processing units). In other words, the present application is not limited to the above-described embodiments, and variations and modifications may be made without departing from the scope of the present application.

While the desirable embodiments according to the present disclosure are described herein with reference to the drawings attached, it should be understood that the present disclosure is not limited thereto. It is clear that a person having an ordinary skill in the art could have easily arrived at a variety of changes and modifications within technical ideas as claimed according to the present disclosure. It is understood that these changes and modifications are obviously involved in the technical range of the present disclosure.

The present application may have the following configurations.

(1) A multilayer wiring substrate, including:
a trench produced at one surface of an insulation layer, the trench having a depth shallower than a thickness of the insulation layer; and
a copper plating applied to the trench.
(2) The multilayer wiring substrate according to (1) above, in which the insulation layer is a build-up layer.
(3) The multilayer wiring substrate according to (1) or (2) above, in which the insulation layer is a core layer.
(4) The multilayer wiring substrate according to any one of (1) to (3) above, in which the insulation layer is an epoxy material including a glass cloth.
(5) The multilayer wiring substrate according to any one of (1) to (4) above, in which the copper plating is applied to fill the trench.
(6) The multilayer wiring substrate according to any one of (1) to (5) above, in which
the trench is produced that do not penetrate through from the one surface to the other surface of the trench.
(7) The multilayer wiring substrate according to any one of (1) to (6) above, in which
the trench is produced at about half depth of the insulation layer.
(8) The multilayer wiring substrate according to any one of (1) to (7) above, in which
the trench is produced at the one surface of the insulation layer in a ground or a power source pattern.
(9) A method of producing a multilayer wiring substrate, including:
producing a trench having a depth shallower than a thickness of an insulation layer on one surface of the insulation layer; and
applying a copper plating to the trench produced on the insulation layer.
(10) A semiconductor product, including:
a multilayer wiring substrate, having:
a trench produced at one surface of an insulation layer, the trench having a depth shallower than a thickness of the insulation layer; and
a copper plating applied to the trench.
(11) The semiconductor product according to (10) above, which is a camera module.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A multilayer wiring substrate comprising: a trench produced at one surface of a build-up layer, the trench having a depth shallower than a thickness of the build-up layer; and a copper plating applied to the trench; and
wherein the trench is produced, at a surface of the build-up layer, in a ground or a power source pattern.

2. The multilayer wiring substrate according to claim 1, wherein the depth of the trench is half of the thickness of the build-up layer.

3. The multilayer wiring substrate according to claim 1, further comprising a core layer, wherein the build-up layer is on a surface of the core layer.

4. The multilayer wiring substrate according to claim 1, wherein the build-up layer is an epoxy material including a glass cloth.

5. The multilayer wiring substrate according to claim 1, wherein the copper plating is applied to fill the trench.

6. The multilayer wiring substrate according to claim 1, wherein the trench does not penetrate through from the one surface to the other surface of the trench.

* * * * *